United States Patent

Giangarra et al.

[11] Patent Number: 6,144,977
[45] Date of Patent: *Nov. 7, 2000

[54] CIRCUIT AND METHOD OF CONVERTING A FLOATING POINT NUMBER TO A PROGRAMMABLE FIXED POINT NUMBER

[75] Inventors: Philip B. Giangarra, Mansfield, Mass.; James D. Dworkin, Chandler, Ariz.

[73] Assignee: Motorola, Inc., Schaumburg, Ill.

[*] Notice: Under 35 U.S.C. 154(b), the term of this patent shall be extended for 676 days.

[21] Appl. No.: 08/499,988

[22] Filed: Jul. 10, 1995

[51] Int. Cl.[7] .............................. G06F 15/00; G06F 7/00; G06F 7/38
[52] U.S. Cl. .......................... 708/204; 708/495; 341/50; 341/78
[58] Field of Search .................. 364/715.03, 715.04, 364/715.08, 745, 748; 341/50, 73–76, 78; 708/204, 205, 209

[56] References Cited

U.S. PATENT DOCUMENTS

| | | | |
|---|---|---|---|
| 5,161,117 | 11/1992 | Waggener, Jr. ................ | 364/715.03 |
| 5,220,589 | 6/1993 | Gard ................................ | 378/19 |
| 5,506,797 | 4/1996 | Koshiba ........................... | 364/718 |
| 5,561,615 | 10/1996 | Kuo et al. ........................ | 364/715.03 |
| 5,574,672 | 11/1996 | Briggs ............................. | 364/715.08 |
| 5,619,198 | 4/1997 | Blackham et al. ............... | 341/50 |

*Primary Examiner*—Emmanuel L. Moise
*Attorney, Agent, or Firm*—Lanny L. Parker

[57] ABSTRACT

A programmable numeric converter (10) converts a floating point number to a fixed point format by selecting the proper offset. The mantissa is loaded with an implied value one into the least significant, or most significant, bits of the shifter (20). The programmable offset is added (24) to the exponent to determine the number of shifts to the mantissa bits. The number of bits of resolution necessary in the fixed point number is reduced because the offset can be programmed to move the decimal point to the left, or to the right, to provide accuracy wherever the significant digits are located. That is, the decimal point is moved left to provide more resolution in the fractional portion of the fixed point number for small numbers. Alternately, the decimal point is moved right to provide more resolution in the whole number portion of the fixed point number for large numbers.

19 Claims, 2 Drawing Sheets

CIRCUIT AND METHOD OF CONVERTING A FLOATING POINT NUMBER TO A PROGRAMMABLE FIXED POINT NUMBER

BACKGROUND OF THE INVENTION

The present invention relates in general to numeric converters and, more particularly, to a programmable floating point to fixed point converter.

Many modern electronic systems perform computations on digital signals. Applications include neural networks and digital signal processing (DSP). For example, microprocessors commonly solve numeric problems such as finding the roots to a polynomial, computing a sum of products, or performing multiply and accumulate operations, all of which can involve multiplication, division, addition, and subtraction. Numbers are generally represented in either fixed point notation or floating point notation. Fixed point notation is typically binary with 2's complement for representation of negative numbers. Floating point numbers have a sign bit and an implied one plus a mantissa multiplied by a number (generally the number 2) raised to an exponent, i.e. $(-1)^S \cdot (1.M) \cdot 2^E$. It is common to convert between floating point and fixed point notation. The mathematical operations can be performed on either the fixed point number or the floating point number.

In order to perform multiply and accumulate operations, first and second digital signals, say 16-bits each, are multiplied together to form a 32-bit product. The product term is added with the prior contents of an accumulator. Successive sets of digital signals are multiplied and accumulated in a similar manner. As the number of digital signals that are multiplied and accumulated increases, the size of the accumulator needed to stored the results increases accordingly. The accumulator can be made for example with a ripple-carry adder having 40 bits of width. However, the ripple carry becomes slower with more bits because each bit must be computed sequentially from least significant to most significant. A 40-bit wide accumulator also consumes a large amount of integrated circuit (IC) die area. Thus, there is a practical limit on the number of bits that can be allocated for accumulation.

Another option for the accumulator is to use a carry-select adder which computes the bits in parallel, typically in groups of four, with and without the carry. The actual carry bits control a group of multiplexers to select the correct result depending on whether or not a carry was present. Although the accumulation speed is greater in a carry-select adder because of the parallel processing, the size concerns on the IC die become an even greater problem with the additional multiplexers and redundant logic.

DETAILED DESCRIPTION OF THE PREFERRED EMBODIMENT

Figure 1:
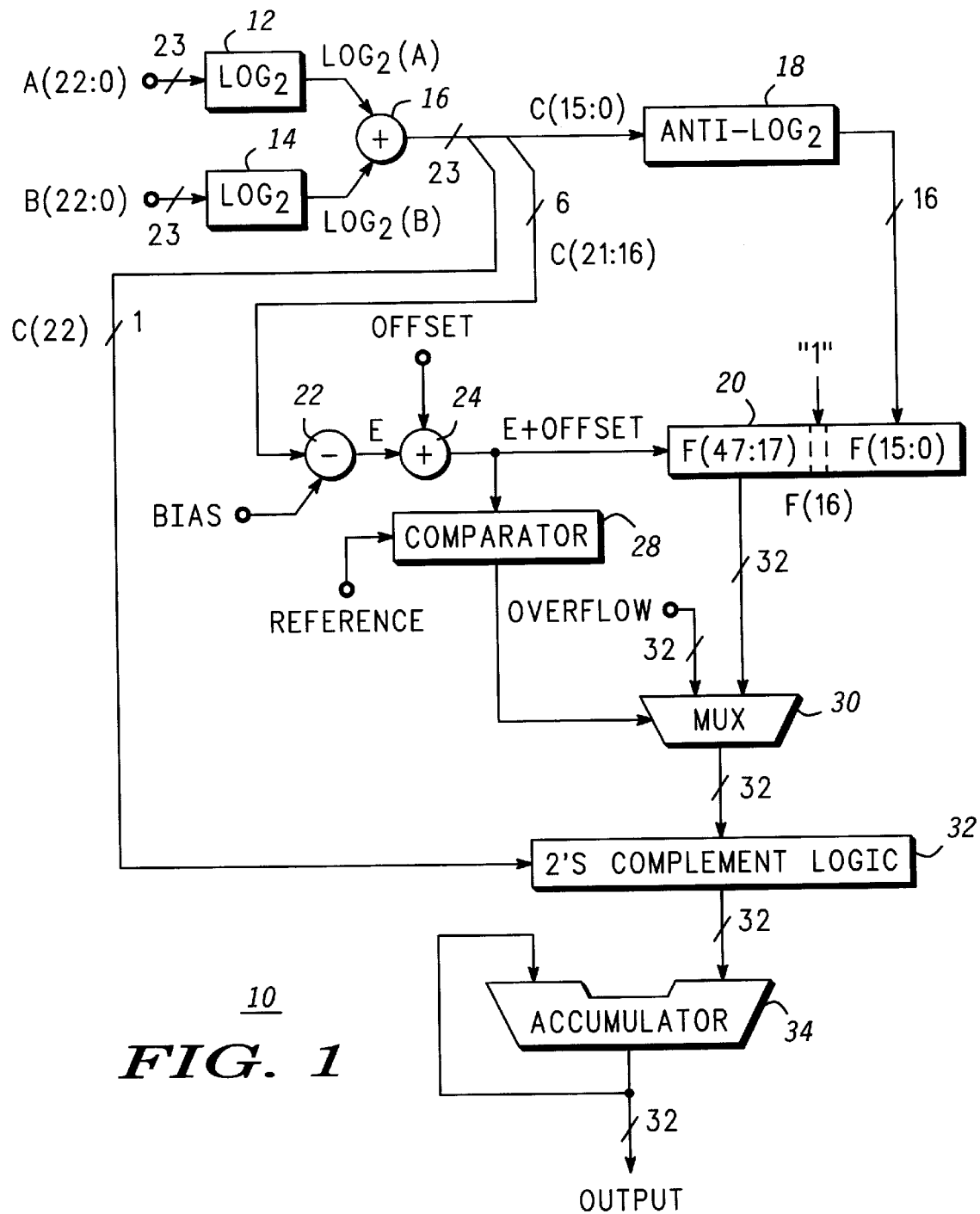
FIG. 1 is a block diagram illustrating a floating point to programmable fixed point converter.

Referring to FIG. 1, a floating point to programmable fixed point converter 10 is shown suitable for manufacturing as an integrated circuit using conventional IC processes. A 23-bit floating point number A is multiplied by a 23-bit floating point number B and the result is converted to a 32-bit fixed point number and then accumulated. The format of floating point numbers A and B is $(-1)^S \cdot (1.M) \cdot 2^E$. The single sign bit "S" is bit 22 of the floating point number. The 16-bit mantissa "M" is bits 15:0 of the floating point number. The 6-bit stored exponent "EXP" is bits 21:16 of the floating point number. The exponent EXP is stored in a form of EXP=E+BIAS, where "E" is the actual exponent and BIAS is a fixed number selected as 32 for the present embodiment. The BIAS allows for expression of very large numbers (positive exponents) and very small numbers (negative exponents). To evaluate the floating point number, it is necessary to subtract the BIAS from the stored exponent. If EXP=64, then $2^{EXP-BIAS}=2^{64-32}$ which is a very large number. Alternately, if EXP=0, then $2^{EXP-BIAS}=2^{0-32}$ which is a very small number.

Many applications such as DSP and neural networks require multiply and accumulate operations of inputs A and B. The multiplication of A and B can be accomplished by $A \cdot B = \text{anti-log}[\log_2(A) + \log_2(B)]$. Logarithms and addition circuits requires less logic than multiplication circuits. Log converter 12 performs a logarithm to the base 2 on floating point number A, while log converter 14 performs a logarithm to the base 2 on floating point number B. In executing a logarithm of A and B, the sign bit is ignored, but carried along, since it is not possible to take the log of a negative number. The exponent bits (21:16) remain unchanged because $\log_2(2^{EXP})=EXP$. The exponent of two, which is understood in the floating point format, i.e. $2^{EXP}$, is simply not used in the log format because the implied exponent of two is no longer applicable in log format.

Figure 2:
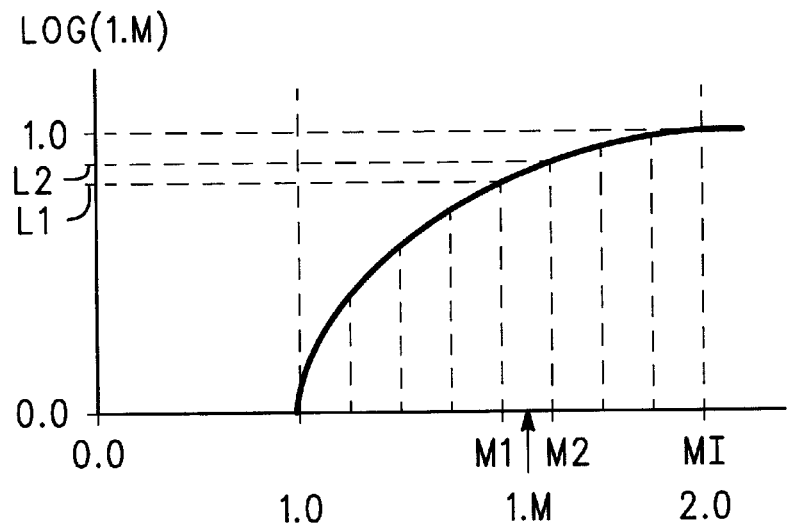
FIG. 2 is a logarithm graph with sample points equally spaced.

The format of 1.M assumes the value of one plus a fraction given by the mantissa bits (15:0). The logarithm of the mantissa bits (15:0) is converted according to the graph shown in FIG. 2. Thus, the range of possible mantissa values from the abscissa axis of FIG. 2 is from 1.0 to 2.0. The resulting $\log_2(1.M)$ is read from the ordinate axis in FIG. 2 in the range bounded by 0.0 and 1.0. The equally spaced points $M_i$ on the graph in FIG. 2 are stored in a table in log converters 12 and 14. If the mantissa 1.M falls between two points stored points, e.g. $M_1$ and $M_2$ with corresponding logarithms $L_1$ and $L_2$, then the corresponding log value is determined by linear interpolation between those two points.

The 23-bit number following the log operation has a format of $N_{LOG}$=integer+fraction where the integer is the 6-bit EXP and the fraction is the 16-bit $\log_2(1.M)$ read from FIG. 2. The logarithms are summed by adder 16 to provide number C(22:0). The output of adder 16 is a 23-bit number C having a sign bit S (22), 6-bit exponent EXP (21:16), and 16-bit mantissa M (15:0) from the summation. The sign bits of A and B are exclusive-OR'ed together to provide sign bit S of C(22:0). If the sign bit of A and B are both zeroes, or both ones, then the sign bit S of C(22:0) is zero indicating a positive number. If the sign bit of A and B are different, then the sign bit S of C(22:0) is one indicating a negative number.

In an alternate embodiment, a single log converter can be used with the logarithms calculated one after another and results stored in separate registers (not shown) for the summation in adder 16.

The sign bit and exponent of C(22:0) are detoured from anti-log converter 18. During the anti-log process, the exponent bits (21:16) remain unchanged because anti-$\log_2$(EXP)=$2^{EXP}$. The implied exponent of two is made applicable again following the anti-log operation because the number is now in floating point format. The format of 0.M in C(15:0) from adder 16 assumes the value of zero plus a fraction given by the mantissa bits. The anti-log of the mantissa bits (15:0) is converted according to the graph shown in FIG. 2. The range of possible mantissa values on the ordinate axis of FIG. 2 is from 0.0 to 1.0. The resulting anti-log$_2$(0.M) is read from the graph in the range bounded by 1.0 and 2.0 on the abscissa axis. The output of anti-log converter 18, in combination with C(22) and C(21:16), is a 23-bit floating point number A·B with a format of $(-1)^S \cdot (1.M) \cdot 2^E$.

As a feature of the present invention, the 23-bit floating point number A·B is converted to a 32-bit fixed point number that can be accumulated in a 32-bit accumulator. The 32-bit accumulator requires less space than the prior art 40-bit accumulator. The floating point to fixed point numeric conversion is programmable with the value of OFFSET. If OFFSET is selected as a low number, e.g. 1 or 2, then the converter provides more accuracy in the whole number portion of the fixed point number. If OFFSET is selected as a high number, e.g. 31 or 32, then the converter provides more accuracy in the fractional portion of the fixed point number. If OFFSET is selected as an intermediate number, e.g. 16, then the converter provides approximately equal accuracy for the whole number portion and the fractional portion of the fixed point number.

First, the 16-bit mantissa C(15:0) of A·B from anti-log 18 is placed in sixteen least significant bit locations of 48-bit shifter 20, i.e. F(15:0). The thirty-two most significant bit locations F(47:16) of shifter 20 are of primary interest in obtaining the fixed point number result. The sixteen least significant bit locations F(15:0) of shifter 20 serve as a storage location for the mantissa prior to the shifting operation as discussed below.

The BIAS is removed from the exponent C(21:16)=EXP by subtracting BIAS=32 from bits C(21:16) in subtracter 22, i.e. EXP-BIAS=actual exponent E. A subtracter can be implemented by taking 2's complement of BIAS and adding it to C(21:16), or simply inverting bit 21 since BIAS is known to be value 32. The floating point to fixed point converter is made programmable by the OFFSET signal applied to one input of adder 24. The actual exponent E from subtracter 22 is applied to a second input of adder 24 for providing a shift control signal E+OFFSET. The output of adder 24 controls the number of shifts in shifter 20. A fixed "1" is loaded into the bit position F(16). There is an implied decimal point between bits F(16:15).

In one embodiment, shifter 20 is a barrel shifter that simultaneously shifts the number of bit positions dictated by adder 24. For example, if E+OFFSET is one, then the barrel shifter simultaneously shifts all bits one position to the left during one clock cycle. If E+OFFSET is two, then the barrel shifter simultaneously shifts all bits two positions to the left, and so on. In an alternate embodiment, shifter 20 can be a serial shift register that shifts one bit each clock cycle. In that case, the output of adder 24 would have to be sequenced, for example with a counter (not shown), to control the individual shifts.

With prior knowledge of the range of values for A and B, then OFFSET can be programmed to give maximum resolution for the fixed point number F with a minimum number of bits. If the result is known to have more whole number digits and little fractional content, then the resolution to the left of the decimal point in the fixed point number should be maximized and the resolution to the right of the decimal point should be minimized. For example, assume A=1000.0 and B=3.0005, and the product of A·B is 3000.5. Therefore, OFFSET is selected as 2 to provide more accuracy in the whole number portion of the fixed point number. The product A·B is "0 101011 0111011100010000" in 23-bit floating point format. The 16-bit mantissa of A·B "0111 0111 0001 0000" is loaded into the sixteen least significant bit locations F(15:0) of shifter 20. BIAS is subtracted from the exponent C(22:16) in subtracter 22 and then summed with OFFSET in adder 24 to generate the shift control signal, i.e. EXP-BIAS+OFFSET=E+OFFSET=11+2=13.

With the fixed "1" loaded into the bit location F(16), shifter 20 operating as a barrel shifter simultaneously shifts its contents thirteen bit positions to the left, i.e. toward more significant bit locations. After the shifting operation, the fixed point number in bits F(47:16) of shifter 20 is "00000000000000000010111011100010". The value of OFFSET determines the new decimal point location. A value of OFFSET=2 signifies that the implied decimal point is moved to the left two places. The implied decimal point moves from between bits F(16:15) to between bits F(18:17). Shifter 20 has an effective value 101110111000.10 in bit locations F(29:16). Evaluated as a base 2 binary number, the fixed point number F(29:16) has a value of $1 \cdot 2^{11} + 0 \cdot 2^{10} + 1 \cdot 2^9 + 1 \cdot 2^8 + 1 \cdot 2^7 + 0 \cdot 2^6 + 1 \cdot 2^5 + 1 \cdot 2^4 + 1 \cdot 2^3 + 0 \cdot 2^2 + 0 \cdot 2^1 + 0 \cdot 2^0 + 1 \cdot 2^{-1} + 0 \cdot 2^{-2} = 2048 + 512 + 256 + 128 + 32 + 16 + 8 + 0.5 = 3000.5$. Thus, the programmable value of OFFSET has provided more resolution in the whole number portion of the fixed point number.

As an error check, the sum of E+OFFSET is compared with a fixed REFERENCE=32 in comparator 28. If E+OFFSET≦32, then the fixed point result in shifter 20 passes through multiplexer 30 to logic circuit 32. If E+OFFSET>32, then a 32-bit OVERFLOW signal having all logic ones passes through multiplexer 30 to logic circuit 32. Logic circuit 32 performs a 2's complement, i.e. invert all bits and add one, if C(22) is logic one indicating a negative number. Logic circuit 32 passes the output of multiplexer 30 to accumulator 34 unchanged if C(22) is logic zero, i.e. a positive number. Accumulator 34 sums the fixed point number with its prior contents and provides an OUTPUT signal representing a multiply and accumulate operation of A and B.

In another example, assume that the result is known to have more fractional content and fewer whole number digits. In this case, the resolution to the left of the decimal point in the fixed point number should be minimized and the resolution to the right of the decimal point should be maximized. Given A=−0.25 and B=6.25 with the product of A·B=−1.5625, the product A·B is "1 100000 1001000000000000" in 23-bit floating point format. OFFSET is programmed as 28 to provide more accuracy in the fractional portion of the fixed point number. The 16-bit mantissa of A·B "1001 0000 0000 0000" is loaded into the sixteen least significant bit locations F(15:0) of shifter 20. BIAS is subtracted from the exponent C(22:16) in subtracter 22 and then summed with OFFSET in adder 24 to generate the shift control signal, i.e. EXP-BIAS+OFFSET=E+OFFSET=0+28=28.

With the fixed "1" loaded into the bit location F(16), shifter 20 operating as a barrel shifter simultaneously shifts its contents twenty-eight bit positions to the left. After the shifting operation, the fixed point number in bits F(47:16) is "00011001000000000000000000000000". The value of OFFSET determines the decimal point location. A value of OFFSET=28 signifies that the implied decimal point is moved to the left twenty-eight places. The implied decimal point moves from between bits F(16:15) to between bits F(44:43). Shifter 20 has an effective value 1.10010 in bit locations F(44:40). The fixed point number F(29:16) has a base 2 value of $1\cdot2^0+1\cdot2^{-1}+0\cdot2^{-2}+0\cdot2^{-3}+1\cdot2^{-4}=1+0.5+0.0625=-1.5625$. The negative sign is brought along from C(22).

The sum of E+OFFSET is compared with a fixed REFERENCE=32 in comparator 28. E+OFFSET≦32 so the fixed point result in shifter 20 passes through multiplexer 30 to logic circuit 32. Logic circuit 32 performs a 2's complement, i.e. invert all bits and add one, because C(22) is logic one indicating a negative number. This allows accumulator 34 to add the 2's complement version of the negative number. The 2's complement number is "11100111000000000000000000000000". Accumulator 34 sums the fixed point number with its prior contents and provides an OUTPUT signal representing a multiply and accumulate operation of A and B. Thus, the programmable value of OFFSET has provided more resolution in the fractional portion of the fixed point number.

Figure 3:
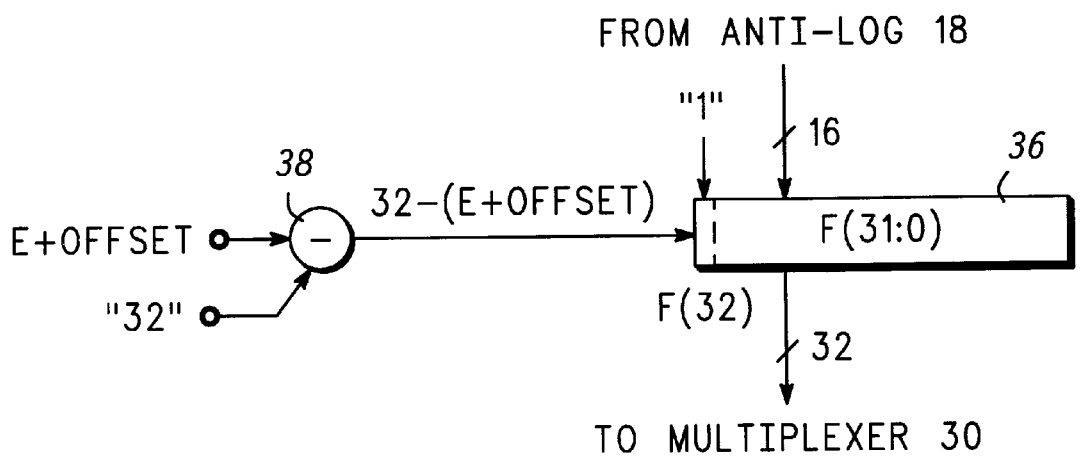
FIG. 3 is a block diagram illustrating an alternate embodiment of the programmable floating point to fixed point converter.

Turning to FIG. 3, an alternate embodiment of the present invention is shown, the 16-bit mantissa from anti-log converter 18 is loaded into the more significant bit locations F(31:16) of a 33-bit shifter 36. A fixed "1" is loaded into the most significant bit position F(32). There is an implied decimal point between bits F(32:31). The value E+OFFSET from adder 24 in FIG. 1 is subtracted from a value 32 in subtracter 38 to accommodate the shift right operation in shifter 36. The result 32−(E+OFFSET) determines the number of shifts to the right in shifter 36 to reach the desired fixed point number.

Assume A=4.0 and B=5.0 with the product of A·B=20.0. In 23-bit floating point format the product A·B is "0 100100 0100000000000000". OFFSET is programmed as 16 to provide equal accuracy between the fractional portion and the whole number portion of the fixed point number. The 16-bit mantissa of A·B "0100 0000 0000 0000" is loaded into the bit locations F(31:16) of shifter 36. BIAS is subtracted from the exponent C(21:16) in subtracter 22 and then summed with OFFSET in adder 24 in FIG. 1, i.e. EXP−BIAS+OFFSET=E+OFFSET=4+16=20. With the fixed "1" loaded into the bit location F(32), shifter 36 operating as a barrel shifter simultaneously shifts its contents twelve (32−(E+OFFSET)) bit positions to the right. After the shifting operation, the fixed point number in bits F(32:0) of shifter 36 is "000000000000101000000000000000000". The value of OFFSET determines the decimal point location. A value of OFFSET=16 signifies that the implied decimal point is moved to the right sixteen places. The implied decimal point moves from between bits F(32:31) to between bits F(16:15). Shifter 36 has an effective value 10100.0 in bit locations F(20:15). F(20:15) has a base 2 value of $1\cdot2^4+0\cdot2^3+1\cdot2^2+0\cdot2^1+\cdot2^0+0\cdot2^{-1}=16+4=20$.

The OFFSET has a value less than 32 so the 32=bit fixed point number "10000000000000101000000000000000" is routed through multiplexer 32 and accumulated in accumulator 34 in FIG. 1. Logic circuit 32 has no effect since the result is a positive number, i.e. C(22)=0. The programmable value of OFFSET has provided equal resolution in the whole number portion and the fractional portion of the fixed point number.

By now it should be appreciated that the present invention provides a programmable floating point to fixed point converter. The converter is programmable in that any floating point number can be converted to a fixed point format by selecting the proper offset which is added to the exponent to determine the number of shifts to the mantissa bits. The number of bits of resolution in the fixed point number is reduced because the offset can be selected to move the decimal point to the left, or to the right, to provide accuracy wherever the significant digits are expected to be located. That is, for numbers less than one, the decimal point is moved left to provide more resolution in the fractional portion of the fixed point number. Alternately, for numbers much greater than one, the decimal point is moved right to provide more resolution in the whole number portion of the fixed point number. The programmable offset can place the decimal point in the middle for fixed point numbers that have similar resolution in the whole number portion and the fractional portion. The accumulator can be kept smaller with the programmable fixed point numbers.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A programmable floating point to fixed point converter, comprising:
   a shifter having a data input coupled for receiving a signal representing a mantissa of a floating point number and an output for providing a fixed point number;
   an adder having a first input coupled for receiving an offset signal that programs the floating point to fixed point conversion, a second input coupled for receiving a signal representing an exponent of said floating point number, and an output coupled to a shift control input of said shifter for controlling shifting of said mantissa of said floating point number to convert to the fixed point number.

2. The programmable floating point to fixed point converter of claim 1 wherein said shifter includes a second input into a bit location coupled for receiving a fixed signal of value one.

3. The programmable floating point to fixed point converter of claim 2 wherein said mantissa of said floating point number is loaded into least significant bits of said shifter.

4. The programmable floating point to fixed point converter of claim 3 further including:
   a comparator having a first input coupled for receiving a reference signal and a second input coupled to said output of said adder;
   a multiplexer having a first input coupled for receiving an overflow signal, a second input coupled to an output of said shifter, and a control input coupled to an output of said comparator;
   a logic circuit coupled to an output of said multiplexer and further coupled for receiving a signal representing a sign bit of said floating point number for taking 2's complement of a negative number; and
   an accumulator having a first input coupled to an output of said logic circuit, and a second input coupled to an output of said accumulator.

5. The programmable floating point to fixed point converter of claim 2 wherein said shifter is a barrel shifter.

6. A programmable numeric converter for changing a floating point number to a fixed point number, comprising:
   a shifter having a data input coupled for receiving a signal representing a mantissa of the floating point number and an output for providing the fixed point number; and
   an adder having a first input coupled for receiving a programmable offset signal that programs the floating point to fixed point conversion, a second input coupled for receiving a signal representing an exponent of the floating point number, and an output coupled to a shift control input of said shifter for controlling shifting of said mantissa of the floating point number to convert to the fixed point number.

7. The programmable numeric converter of claim 6 wherein said shifter includes a second input into a most significant bit location coupled for receiving a fixed signal of value one.

8. The programmable numeric converter of claim 7 wherein said mantissa of the floating point number is loaded into more significant bits of said shifter.

9. The programmable numeric converter of claim 8 wherein said shifter is a barrel shifter.

10. The programmable numeric converter of claim 9 further including:

a comparator having a first input coupled for receiving a reference signal and a second input coupled to said output of said adder;

a multiplexer having a first input coupled for receiving an overflow signal, a second input coupled to an output of said shifter, and a control input coupled to an output of said comparator;

a logic circuit coupled to an output of said multiplexer and further coupled for receiving a signal representing a sign bit of the floating point number for taking 2's complement of a negative number; and an accumulator having a first input coupled to an output of said logic circuit, and a second input coupled to an output of said accumulator.

11. A method of converting a floating point number to a programmable fixed point number, comprising the steps of:

adding an offset signal that programs the floating point to programmable fixed point conversion to a signal representing an exponent of the floating point number for providing a shift control signal;

loading a signal representing a mantissa of the floating point number into a shifter; and shifting said mantissa in response to said shift control signal to transform said mantissa of the floating point number into the fixed point number.

12. The method of claim 11 further including the steps of:

loading a fixed signal of value one into a bit location of said shifter; and shifting said mantissa toward more significant bit locations in response to said shift control signal.

13. The method of claim 12 further including the step of moving a decimal point of the fixed point number left a number of bits equal to said offset signal.

14. The method of claim 11 further including the steps of:

loading a fixed signal of value one into a most significant bit location of said shifter; and shifting said mantissa toward less significant bit locations in response to said shift control signal.

15. The method of claim 14 further including the step of moving a decimal point of the fixed point number right a number of bits equal to said offset signal.

16. The method of claim 15 further including the step of comparing a reference signal to said shift control signal and providing a compare signal.

17. The method of claim 16 further including the step of multiplexing the fixed point number with an overflow signal in response to said compare signal.

18. The method of claim 17 further including the step of computing 2's complement of a negative number in response to said signal representing said exponent of the floating point number.

19. The method of claim 18 further including the step of accumulating the fixed point number.

* * * * *